United States Patent [19]

Blum

[11] Patent Number: 5,270,431
[45] Date of Patent: Dec. 14, 1993

[54] PREPARATION OF OLIGOMERIC OR POLYMERIC RADIATION-REACTIVE INTERMEDIATES FOR SOLVENT-STRUCTURED LAYERS

[75] Inventor: Rainer Blum, Ludwigshafen, Fed. Rep. of Germany

[73] Assignee: BASF Aktiengesellschaft, Ludwigshafen, Fed. Rep. of Germany

[21] Appl. No.: 863,514

[22] Filed: Mar. 31, 1992

Related U.S. Application Data

[63] Continuation of Ser. No. 614,980, Nov. 16, 1990, abandoned, which is a continuation of Ser. No. 216,613, Jul. 8, 1988, abandoned.

[30] Foreign Application Priority Data

Jul. 23, 1987 [DE] Fed. Rep. of Germany ....... 3724368

[51] Int. Cl.$^5$ ............................................ C08G 18/02
[52] U.S. Cl. ...................................................... 528/69
[58] Field of Search ........................................... 528/69

[56] References Cited

U.S. PATENT DOCUMENTS

| | | | |
|---|---|---|---|
| Re. 30,186 | 1/1980 | Rubner et al. | 430/325 |
| 2,958,704 | 11/1960 | Dinbergs et al. | 528/69 X |
| 3,814,776 | 6/1974 | Fischer et al. | 260/309.5 |
| 3,855,379 | 12/1974 | Araki et al. | 528/69 X |
| 3,957,512 | 5/1976 | Kleeberg et al. | 96/35.1 |
| 4,006,270 | 2/1977 | Morgan | 528/69 X |
| 4,040,831 | 8/1977 | Rubner et al. | 96/35.1 |
| 4,287,294 | 9/1981 | Rubner et al. | 430/306 |
| 4,292,398 | 9/1981 | Rubner et al. | 430/306 |
| 4,338,427 | 7/1982 | Maekawa et al. | 528/53 |
| 4,385,165 | 5/1983 | Ahne et al. | 528/53 |
| 4,515,887 | 5/1985 | Davis | 430/283 |
| 4,548,891 | 10/1985 | Riediker et al. | 430/283 |

FOREIGN PATENT DOCUMENTS

| | | | |
|---|---|---|---|
| 2437369 | 2/1976 | Fed. Rep. of Germany . | |
| 0080428 | 5/1984 | Japan | 528/69 |
| 63-177126 | 7/1988 | Japan | 430/284 |
| 63-183439 | 7/1988 | Japan | 528/75 |
| 1173608 | 3/1967 | United Kingdom . | |
| 1156379 | 6/1969 | United Kingdom | 528/69 |
| 1060576 | 10/1969 | United Kingdom . | |

OTHER PUBLICATIONS

Gary C. Davis, "Photosensitive Polyimide Siloxane for Electronic Applications," *Organic Coatings and Applied Polymer Science Proceedings,* vol. 48, Preprints of Papers Presented by the Division of Organic Coatings and Plastics Chemistry at the American Chemical Society, 185th National Meeting, Seattle, Washington, Mar. 20-25, 1983, pp. 70-75.

*Primary Examiner*—Maurice J. Welsh
*Attorney, Agent, or Firm*—Keil & Weinkauf

[57] ABSTRACT

Oligomeric or polymeric radiation-reactive intermediates of polyamides, polyisoindoloquinazolinediones, polyoxazinediones or polyquinazolinediones are prepared by a process in which a carboxyl-containing polyadduct of aromatic and/or heterocyclic tetracarboxylic dianhydrides and diamino compounds, or a carboxyl-containing polyadduct of aromatic and/or heterocyclic dihydroxydicarboxylic acids and diisocyanates, or a carboxyl-containing polyadduct of aromatic and/or heterocyclic diaminodicarboxylic acids and diisocyanates is subjected to an addition reaction with an ethylenically unsaturated monoisocyanate.

The products prepared according to the invention are suitable as structure-forming functional or auxiliary layers in the construction of electronic components.

9 Claims, No Drawings

PREPARATION OF OLIGOMERIC OR POLYMERIC RADIATION-REACTIVE INTERMEDIATES FOR SOLVENT-STRUCTURED LAYERS

This application is a continuation of application Ser. No. 07/614,980, filed on Nov. 16, 1990 now abandoned, which is a continuation of Ser. No. 07/216,613, filed on Jul. 8, 1988 now abandoned.

The present invention relates to oligomeric or polymeric radiation-reactive intermediates of polyamides, polyisoindoloquinazolinediones, polyoxazinediones and polyquinazolinediones, processes for the preparation of these radiation-reactive intermediates and their use.

It is known that structured layers, in particular for electronic applications, can be produced by a method in which soluble intermediates A which contain radiation-crosslinkable double bonds are first applied to the substrate from solutions and are dried under mild conditions. A crosslinked intermediate B is then formed under a mask using radiation of a suitable wavelength. The unexposed, ie. uncrosslinked, parts, which still contain the intermediates A, are then washed out with suitable solvents. The structure resulting from the intermediate B is then converted into the final functional structure of stage C by using elevated temperatures.

It is necessary to introduce radiation-sensitive groups, in particular ethylenic double bonds, into the intermediate A. This step is the subject of numerous patents and is described in, for example, DE-A-2 308 830, DE-A-2 437 397, DE-A-2 437 413, DE-A-2 437 369, DE-A-2 919 840, DE-A-2 919 841 and DE-A-2 933 826.

Intermediates of the stated type, which are soluble in organic solvents, are disclosed in, for example, German Patent 2,308,830. The known polymeric intermediates are polyadducts or polycondensates of polyfunctional carbocyclic or heterocyclic compounds carrying radiation-sensitive radicals with diamines, diisocyanates, bisacyl chlorides or dicarboxylic acids. The compounds carrying radiation-sensitive radicals contain two carboxyl, carboxylic acid chloride, amino, isocyanate or hydroxyl groups which are suitable for addition or condensation reactions and radiation-reactive groups, some of which are bonded in the ortho or para position with respect to the former groups by ester-like bonds to carboxyl groups, and the diamines, diisocyanates, bisacyl chlorides and dicarboxylic acids to be reacted with these compounds have one or more cyclic structural elements.

Radiation-reactive polyimide intermediates are prepared in particular by a method in which unsaturated alcohols, such as allyl alcohol, are subjected to addition reactions with tetracarboxylic dianhydrides, such as pyromellitic dianhydride, the free carboxyl groups of the resulting diesters are converted into acyl chloride groups, and the diester-bisacyl chlorides formed are subjected to a polycondensation reaction with a (generally aromatic) diamine, such as diaminodiphenyl ether. If diamino compounds which contain ortho amido groups are used, polyisoindoloquinazolinediones are formed in a corresponding manner.

Polyoxazinedione intermediates are formed by polyaddition of diisocyanates, such as diphenylmethane diisocyanate, with phenolic hydroxyl groups of olefinically unsaturated diesters, such as methylenedisalicylates, and polyquinazolinediones are formed in a similar manner by polyaddition of diisocyanates with amino groups of olefinically unsaturated diesters.

The known preparation processes generally require a plurality of reaction steps as well as low temperatures. Moreover, on the one hand intensive purification of the reaction products is required when acyl chlorides are used, white on the other hand the synthesis of unsaturated diesters of the stated type is difficult to carry out.

DE-A-2 933 826 describes a method for avoiding some of these difficulties by subjecting unsaturated epoxides to an addition reaction with carboxyl-containing intermediates. The disadvantage of this method is that carboxyl groups react at a satisfactory rate with epoxide groups only at elevated temperatures and in the presence of catalysts. The result is that frequently insoluble products are formed, for example due to partial imidization, or partially crosslinked products result.

It is an object of the present invention to provide oligomeric and/or Polymeric intermediates of polyimides, polyisoindoloquinazolinediones, polyoxazinediones and polyquinazolinediones, which are soluble in organic solvents and radiation-reactive and can be prepared in a simple manner.

It is a further object of the present invention to provide a novel method for introducing the double bonds into the intermediate A which can not only be carried out in a technically simpler manner but, in the conversion of intermediate B into the end product C, also entails a smaller weight loss and hence leads to better structural quality.

We have found these objects are achieved, suprisingly and according to the invention, by introducing the double bond via certain isocyanates during the preparation of the intermediate A.

More particularly, these objects are achieved in a technically advantageous manner when the intermediates (A) are prepared from adducts of certain ethylenically unsaturated monoisocyanates with carboxyl-containing polyadducts (PA) of aromatic and/or heterocyclic tetracarboxylic dianhydrides and diamino compounds or diamino compounds having one or more ortho amido groups, or with carboxyl-containing polyadducts of aromatic and/or heterocyclic dihydroxydicarboxylic acids or corresponding diaminodicarboxylic acids and diisocyanates.

The present invention accordingly provides a process for the preparation of oligomeric or polymeric radiation-reactive intermediates of polyamides, polyisoindoloquin-azolinediones, polyoxazinediones or polyquinazolinediones, wherein carboxyl-containing polyadducts of aromatic and/or heterocyclic tetracarboxylic dianhydrides and diamino compounds or with carboxyl-containing polyadducts of aromatic and/or heterocyclic dihydroxydicarboxylic acids and diisocyanates or with carboxyl-containing polyadducts of aromatic and/or heterocyclic diaminodicarboxylic acids and diisocyanates are subjected to an addition reaction with ethylenically unsaturated monoisocyanates.

Particularly suitable ethylenically unsaturated monoisocyanates are compounds of the general formula

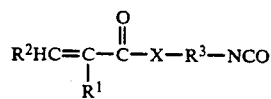

where $R^1$ is hydrogen or alkyl of 1 to 5 carbon atoms, $R^2$ is hydrogen or 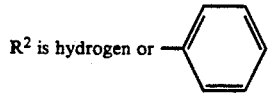.

$R^3$ is a divalent alkylene radical of 1 to 12 carbon atoms, cycloalkylene, arylene or a radical $—R^4—Y—R^5—$, where Y is O, S, SO$_2$, CO or NR$^1$ and R$^4$ and R$^5$ are identical or different and are each alkylene or arylene, and the alkylene, cycloalkylene and arylene radicals may furthermore be halogen-substituted or alkyl-substituted, and X is 0 or NH, vinyl isocyanate and reaction products of hydroxyalkyl (meth)acrylates with diisocyanates, from 1.8 to 2.2 isocyanate groups being used per hydroxyl group, reaction products of olefinically unsaturated monoalcohols with diisocyanates, from 1.8 to 2.2 isocyanate groups being used per mole of hydroxyl groups, reaction products of olefinically unsaturated monocarboxylic acids with diisocyanates, from 1.8 to 2.2 isocyanate groups being used per carboxyl group, reaction products of ethylenically unsaturated amines with diisocyanates, from 1.8 to 2.2 isocyanate groups being used per amino group, reaction products of ethylenically unsaturated carboxyl anhydrides with diisocyanates, from 1.8 to 2.2 isocyanate groups being used per anhydride group, and mixtures of such ethylenically unsaturated monoisocyanates.

In a particularly advantageous procedure, furthermore, the reaction products to be used as ethylenically unsaturated monoisocyanates are prepared in the presence of carboxyl-containing Polyadducts.

The present invention furthermore relates to the use of the radiation-reactive intermediate prepared according to the invention for the production of plastic coatings for optical fibers for optical waveguides and as structure-forming functional or auxiliary layers in the construction of electronic and/or microelectronic components, after prior exposure under a mask followed by solvent structuring.

Particular, unexpected technical advantages of the intermediates prepared according to the invention and their further processing during use are the technically easier introduction of the double bonds into ready made carboxyl-containing polyadducts, whose molecular weight can be established beforehand, and the fact that, because of the good reactivity of isocyanate groups with the carboxyl-containing polyadducts, the reactions can be carried out at low temperatures, with the result that get formation and side reactions are avoided.

It is also surprising that the novel substances exhibit a smaller weight loss than expected in the conversion from intermediate 8 to the end product C, with the result that better structural quality is achieved.

Regarding the novel process and the components to be used in the said process, the following may be stated specifically.

For the purposes of the present invention, tetracarboxylic dianhydride means compounds which possess two or more anhydride groups.

The term diamino compounds is intended to include compounds which contain the structural element

ie. derivatives of hydrazine.

Diamino compounds having one or more ortho amido groups are compounds which carry one or more amido groups which are ortho to one of the two amino groups of the diamino compound.

The oligomeric or polymeric polyimide, polyisoindoloquinazolinedione, polyoxazolinedione and polyquinazolinedione intermediates prepared according to the invention are radition-sensitive and can thus easily be crosslinked. the crosslinked products can then be converted in a simple manner by thermal treatment into highly heat-resistant polyamides, polyisoindoloquinazolinediones, polyoxazinediones and polyquinazolinediones. Furthermore, these polymer intermediates are readily soluble in organic solvents, in particular in polar solvents. From the economic and ecological point of view, it is also important, because of the presence of hydroxyl groups, for the intermediates to be capable of being partially or completely processed in or from partially aqueous solution.

The novel polymer intermediates are particularly suitable for the production of structured, highly heatresistant protective and insulating layers in microelectronics (production of fine structure) and for use as a photoresist.

The radiation-reactive intermediates prepared according to the invention may be assumed in general to have the following structure:

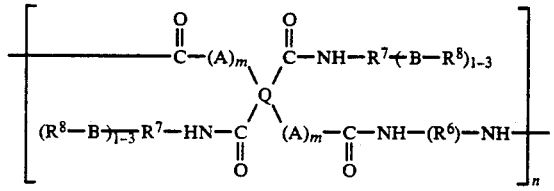

In this formula I, n is an integer from 2 to 1,000, preferably from 5 to 100.

Q is an unhalogenated or halogenated, partly or wholly aromatic and/or heterocyclic tetravalent, ie. tetrafunctional, radical in which two valencies are arranged adjacent to one another; if Q has a plurality of aromatic and/or heterocyclic structural elements, the pairs of valencies are each present at terminal structural elements of this type;

R$^6$ is an unhalogenated or halogenated divalent, ie. difunctional, radical having an aliphatic and/or cycloaliphatic structure which may contain hetero atoms, and/or an aromatic and/or heterocyclic structure;

R$^7$ is a polyfunctional radical, preferably a difunctional radical, having an aliphatic and/or cycloaliphatic and/or aromatic and/or heterocyclic structure;

A is —O— or —NH—;

m is 0 or 1;

B is a bridge member which is formed from the reaction of isocyanate groups with OH, anhydride, carboxyl, secondary or primary amino, amido or urethane groups and R$^8$ is an olefincally unsaturated radical.

The novel radiation-reactive intermediates are thus adducts of olefinically unsaturated isocyanates with carboxyl-containing prepolymers. These prepolymers may be polyadducts of tetracarboxylic dianhydrides and diamino compounds (polyimide prepolymers), polyadducts of tetracarboxylic dianhydrides and diamino compounds having ortho amido groups (polyisoindoloquinazolinedione prepolymers), polyadducts of dihydroxydicarboxylic acids and diisocyanates (polyoxazinedione prepolymers), and polyadducts of diaminodicarboxylic acids and diisocyanates (polyquinazolinedione prepolymers).

The preferably used tetracarboxylic dianhydrides are the dianhydride of pyromellitic acid and of benzophenonetetracarboxylic acid.

Suitable diamino compounds are the usual aromatic diamino compounds, 4,4'-diaminodiphenyl ether being preferred. In the case of the o-aminoamides, 4,4'-diaminodiphenyl-3,3'-dicarboxamide is preferred.

A preferably used dihydroxydicarboxylic acid is 4,4'-dihydroxydiphenylmethane-3,3'-dicarboxylic acid (methylenedisalicyclic acid), and a preferably used diaminodicarboxylic acid is 4,4'-diaminodiphenyl-3,3'-dicarboxylic acid.

4,4'-diphenylmethane diisocyanate is the preferred diisocyanate.

According to the invention, the stated carboxylcontaining prepolymers are subjected to an addition reaction with ethylenically unsaturated monoisocyanates.

Ethylenically unsaturated monoisocyanates to be used according to the invention may be of the general formula

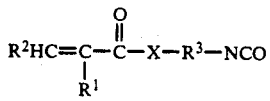

where X is O or NH, R$^1$ is H or C$_1$-C$_5$-alkyl, in particular methyl or ethyl, R$^2$ is H or

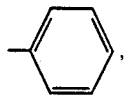

R$^3$ is a divalent alkylene radical of 1 to 12 carbon atoms, in particular hexamethylene, cycloalkylene, eg. cyclohexylene, an isophorone radical, arylene, eg. phenylene or naphthylene, or a radical —R$^4$—Y—R , where Y is —O—, —S—, —CO—, —SO$_2$— or —NR$^1$— and R$^4$ and R$^5$ are identical or different and are each alkylene of 1 to 6 carbon atoms, cycloalkylene or arylene, and the alkylene, cycloalkylene and arylene radicals may furthermore be halogenated or substituted by C$_1$-C$_6$-alkyl.

Examples of such ethylenically unsaturated monoisocyanates are

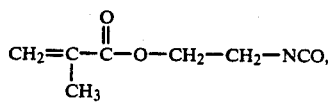

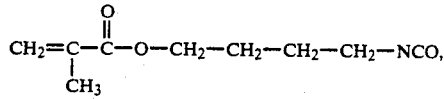

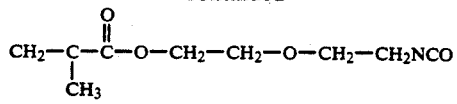

or

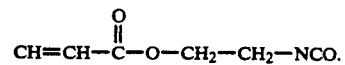

Other suitable ethylenically unsaturated monoisocyanates are vinyl isocyanate and

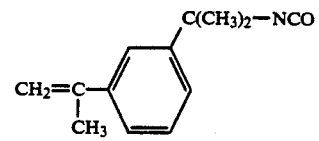

Other suitable unsaturated monoisocyanates are reaction products which are obtainable by partial reaction of polyfunctional isocyanates with olefinically unsaturated compounds which are reactive toward isocyanate groups. The stoichiometric ratios are chosen so that the, polyfunctional isocyanate is in general present in such a theoretical excess that one NCO group is not converted. It is also possible to deviate from this ratio; for example, crosslinking, get formation or an undesirable increase in viscosity may be avoided by a smaller excess of isocyanate. The use of a larger isocyanate excess can give more highly viscous intermediates which may be particularly suitable for applications requiring thick layers.

Polyfunctional isocyanates whose isocyanate groups differ in their reactivity are particularly suitable and are preferred for the reaction with olefinically unsaturated compounds reactive toward isocyanate groups.

Examples of particularly preferred polyfunctional isocyanates which have isocyanate groups of different reactivities and are readily obtainable industrially are toluylene diisocyanate and isophorone diisocyanate.

Unsaturated monoisocyanates which are particularly preferred according to the invention are reaction products of polyfunctional isocyanates with unsaturated compounds reactive toward isocyanate groups and can be obtained., for example, from 2,4-diisocyanatotoluene (2,4-TDI) and 3-isocyanatomethyl-3,5,5-trimethylcyclohexyl isocyanate (IPDI) with allyl alcohol, hydroxyethyl acrylate, hydroxyalkyl (meth)acrylates, such as hydroxyethyl methacrylate, hydroxypropyl acrylate, hydroxypropyl methacrylate, butanediol monoacrylate, butanediol monomethacrylate, N-hydroxymethylacrylamide, N-hydroxymethylmethacrylamide, diethylene glycol monoacrylate, diethylene glycol monomethacrylate, glycerol dimethacrylate, trimethylolpropane dimethacrylate, pentaerythritol trimethacrylate, the equimolar reaction products of glycidyl methacrylate with an organic acid, 2-bromoallyl alcohol, 3-chloro-2-hydroxypropyl methacrylate, the equimolar reaction product of butyl glycidyl ether with acrylic acid; ethylenically unsaturated polyhydroxy compounds, such as trimethylolpropane monoacrylate, pentaerythritol diacrylate, pentaerythritol monoacrylate, trimethylolpropane monomethacrylate, pentaerythritol dimethacrylate, pentaerythritol monomethacrylate, cinnamyl alcohol, cinnamic acid, acrylic acid, methacrylic acid, ethylacrylic acid, crotonic acid, hydroxyalkylcinnamates, the halfesters of cinnamic alcohol and allyl alcohol with dicarboxylic acids, the half esters of cinnamyl alcohol and allyl alcohol with maleic acid, dimethylmaleic acid, (meth)acrylamide, cinnamide, allylamine, dimethylmaleic anhydride, maleic anhydride, isopropylaminopropyl methacrylamide and ethers of monoalcohols with N-hydroxymethyl (meth)acrylamide.

Moreover, mixtures of polyfunctional isocyanates can be reacted with mixtures of olefinically unsaturated compounds reactive toward isocyanates and can be used as ethylenically unsaturated monoisocyanates.

In the case of bifunctional isocyanates and compounds which are monofunctional with respect to isocyanates, the stoichiometric ratio is from 2.2 to 1.8, preferably from 2.0 to 1.8, particularly preferably from 1.95 to 1.8, equivalents of isocyanate groups to one equivalent of groups which are reactive toward isocyanate.

These reaction products can be prepared in the presence or absence of a solvent. It is advantageous to use solvents which are also suitable for the preparation of the carboxyl-containing polyadducts and for the subsequent use of the intermediates. These are in general polar solvents, eg. formamide, acetamide, N-methylformamide, N,N-dimethylformamide, N,N-dimethylacetamide, hexamethylphosphorotriamide and N-methylpyrrolidone.

It is also possible to use low boiling solvents which do not react with isocyanate for the preparation of the reaction products and to remove them by distillation in a subsequent process step, for example in the reaction with the carboxyl-containing intermediate (PA), examples of such solvents being methyl ethyl ketone, methyl isobutyl ketone, ethyl acetate, propyl acetate, butyl acetate, cyclohexyl acetate, tetrahydrofuran, dioxane, diisopropyl ether, diisobutyl ketone, isophorone, cyclohexanone, benzene, toluene and xylene.

These solvents can be used atone or as a mixture.

Furthermore, the reaction products can, according to the invention and particularly preferably, be prepared in situ in solutions of the polyadducts and can be further subjected to addition reactions so that the radiation-reactive intermediates are obtained. Particularly suitable for this in situ preparation are diisocyanates whose isocyanate groups have different reactivities, in combination with unsaturated compounds which react with isocyanate more readily than the carboxyl groups of the polyadducts. Detailed information on the reactivity of isocyanate groups is given in Vieweg/Höchtlen Kunststoff-Handbuch Volume VII Polyurethane, pages 1-39.

Particularly suitable according to the invention are, for example, 2,4-diisocyanatotoluene and 3-isocyanatomethyl-3,5,5-trimethylcyclohexyl isocyanate, in combination with hydroxyalkyl (meth)acrylates having primary hydroxyl groups, with allyl alcohol or with cinnamyl alcohol.

It is particularly surprising that, in this process which is simple to carry out industrially, the reaction takes place very rapidly and completely without crosslinking or get particles occurring.

It is advantageous to catalyze the reaction of the isocyanate groups in the abovementioned reactions in a conventional manner. Information on suitable catalysts for controlling the reaction of isocyanate groups with other chemically reactive groups is likewise given in the literature, in particular in the abovementioned handbook entitled Polyurethane. Examples of suitable catalysts, which may be used in concentrations of about 0.01-5%, are salts or complexes of metals, such as titanium, zinc, iron., copper, manganese, nickel, cobalt, mercury or tin, which are soluble in organic solvents, for example dibutyltin dilaurate, copper acetate, manganese oleate, iron naphthenate or tetrabutyl titanate, as well as organic compounds, in particular tertiary amines, for example trialkylamines, triarylamines, tricyclohexylamines, triamines having mixed substituents, dimethylaminopyridine, N-methylpyrrolidone, N-methylmorpholine, N-methylpiperidine, tetramethylethylenediamine, N,N-dimethylpiperazine and triethylenediamine. Mixtures of catalysts may also be used.

It is also possible to add polymerization inhibitors in order to avoid thermal polymerization during the preparation. Such inhibitors are added, for example, in amounts of from 0.01 to 1%. Examples of suitable compounds are benzoquinone, 2,5-diphenyl-p-benzoquinone, hydroquinone, hydroquinone monomethyl ether, catechol, α-naphthol, mono-tert-butylhydroquinone and pyrogallol.

Formulae 2 and 3 are intended as examples to illustrate the possible structure of the intermediates A prepared according to the invention.

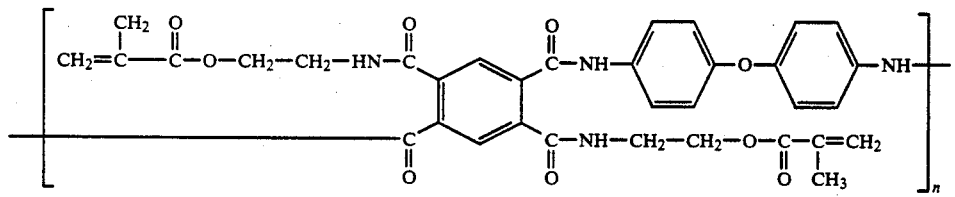

Formula 2

Formula 2 shows an intermediate A which leads to a polyimide in the thermal aftertreatment. It is synthesized from pyromellitic dianhydride and 4,4'-diaminodiphenyl ether, which are reacted with one another in a ratio of about 1:1 and form the carboxyl-containing intermediate (PA). This is then further reacted at the carboxyl group with isocyanatomethyl methacrylate.

Other suitable components instead of or as a mixture with pyromellitic anhydride for carboxyl-containing intermediates (PA), which correspond to the structural principles shown by way of example in formula 2, are, for example, the anhydrides: 2,3,9,10-perylenetetracarboxylic dianhydride, 1,4,5,8-naphthalenetetracarboxylic dianhydride, 2,6-dichloronaphthalene-1,4,5,8-tetracarboxylic dianhydride, 2,7-dichloronaphthalene-1,4,5,8-tetracarboxylic dianhydride, phenanthrene-1,8,9,10-tetracarboxylic dianhydride, pyromellitic dianhydride, 3,3',4,4'-biphenyltetracarboxylic dianhydride, 2,2',3,3'-biphenyltetracarboxylic dianhydride, 4,4'-isopropylidenediphthalic anhydride, 3,3'-isopropylidenediphthalic anhydride, 4,4'-oxydiphthalic anhydride, 4,4'-sulfonyldiphthalic anhydride, 3,3'-oxydiphthalic anhydride, 4,4'-methylenediphthalic anhydride, 4,4'-thiodiphthalic anhydride, 4,4'-acetylidenediphthalic anhydride, 2,3,6,7-naphthalenetetracarboxylic dianhydride, 1,2,4,5-naphthalenetetracarboxylic dianhydride, 1,2,5,6-naphthalenetetracarboxylic dianhydride, benzene-1,2,3,4-tetracarboxylic dianhydride, thiophene-2,3,4,5-tetracarboxylic dianhydride, 1-(3',4'-dicarboxyphenyl) 1,3,3-trimethylindane-5,6-dicarboyxlic dianhydride, 1-(3',4'-dicarboxyphenyl)-1,3,3-trimethylindane-6,7-dicarboxylic dianhydride, 1-(3',4'-dicarboxyphenyl)-3-methylindane-5,6-dicarboxylic dianhydride, 1-(3',4'-dicarboxyphenyl)-3-methylindane-6,7-dicarboxylic dianhydride, 3,3'-4,4'-benzophenonetetracarboxylic anhydride and 4,5,3',4'-benzophenonetetracarboxylic anhydride.

These anhydrides form the radical Q in formula 1.

Instead of or as a mixture with 4,4-diaminodiphenyl ethers, it is also possible to use other diamines, the structural principle shown in formula 2 by way of example being retained. Examples of such diamines are 4,4-methylenebis-(o-chloroaniline), 3,3'-dichlorobenzidine, 3,3'-sulfonyldianiline, 4,4'-diaminobenzophenone, 1,5-diaminonaphthalene, bis-(4-aminophenyl)-dimethylsilane, bis-(4-aminophenyl)-diethylsilane, bis-(4-aminophenyl)-diphenylsilane, bis-(4-aminophenoxy)-dimethylsilane, bis-(4-aminophenyl)-ethylphosphine oxide, N-(bis-(4-aminophenyl))-N-methylamine, N-(bis-(4-aminophenyl))N-phenylamine, 4,4'-methylbis-(3-methylaniline), 4,4'-methylenebis-(2-ethylaniline), 4,4'-methylenebis-(2-methoxyaniline), 5,5-methylenebis-(2-aminophenol), 4,4'-methylenebis-(2-methylaniline), 5,5'-oxybis-(2-aminophenol), 4,4'-thiobis-(2-methylaniline), 4,4'-thiobis-(2-methoxyaniline), 4,4'-thiobis-(2-chloroaniline), 4,4'-sulfonylbis-(2-ethoxyaniline), 4,4'-sulfonylbis-(2-chloroaniline), 5,5'-sulfonylbis-(2-aminophenol), 3,3'-dimethyl-4,4'-diaminobenzophenone, 3,3'-dimethoxy-4,4'-diaminobenzophenone, 3,3'-dichloro-4,4'-diaminobenzophenone, 4,4'-diaminobiphenyl, m-phenylenediamine, m-phenylenediamine, 4,4'-methylenedianiline, 4,4'-oxydianiline, 4,4'-thiodianiline, 4,4'-sulfonyldianiline, 4,4'-isopropylidenedianiline, 3,3'-dimethylbenzidine, 3,3'-dimethoxybenzidine, 3,3'-dicarboxybenzidine, and diaminotoluene.

These diamines simultaneously form the building block denoted by R$^6$ in formula 1.

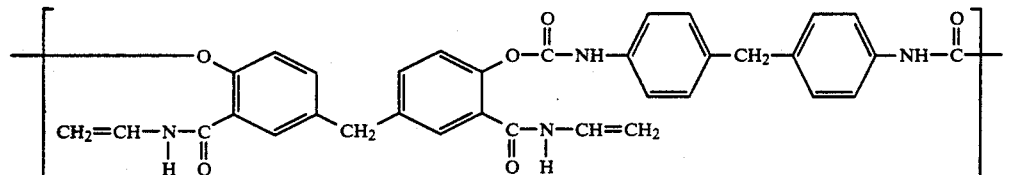

Formula 3 shows the adduct of vinyl isocyanate with the polyadduct of 3,3'-dicarboxy-4,4'-dihydroxydiphenylmethane and 4,4'-diphenylmethane diisocyanate, ie. a radiation-reactive polyoxazinedione intermediate, in particular a polybenzoxazine dione intermediate.

The novel intermediates preferably contain aromatic carboxylic acids as a basic building block for the member Q in formula 1 and, when subjected to a heat treatment, thus give polymers having the following structural units:

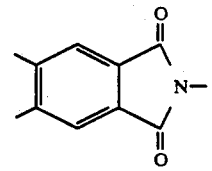

polyimide

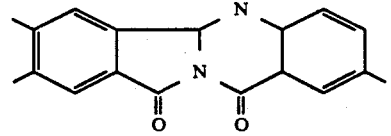

polyisoindoloquinazolinedione

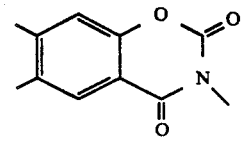

polyoxazinedione

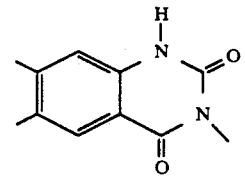

polyquinazolinedione

The term polyimides is intended to include polyesterimides and oplyamidoimides:

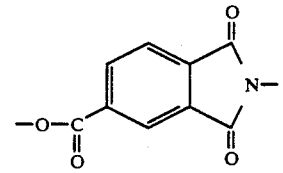

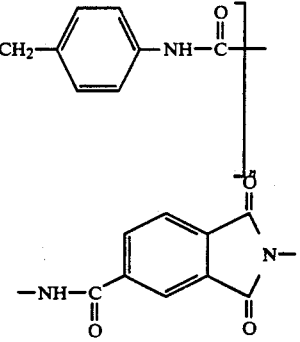

The novel polyimide, polyisoindoloquinazolinedione, polyoxazinedione and polyquinazolinedione intermediates are advantageously prepared by a method in which an aromatic and/or heterocyclic tetracarboxylic dianhydride is reacted with a diamino compound or with a diamino compound having one or more ortho amido groups, or an aromatic and/or heterocyclic dihydroxydicarboxylic acid or a corresponding diaminodicarboxylic acid is reacted with a diisocyanate to give a carboxyl-containing reaction product, ie. a polyadduct (PA), and the reaction product is reacted with an olefinically unsaturated monoisocyanate at room temperature or at up to about 100° C. in an organic solvent, in the presence or absence of polymerization inhibitors and/or catalysts for the isocyanate reaction.

The initially formed polyadducts (PA) can also be reacted in situ with a polyfunctional isocyanate and an olefinically unsaturated compound which is monofunctionally reactive toward isocyanate groups, in the presence or absence of polymerization inhibitors and/or catalysts for the isocyanate reaction.

These reactions are generally carried out at room temperature or at below 100° C. since marked cyclization occurs above this temperature and insoluble cyclization products may form at a certain degree of cyclization which is dependent on the solvent used and on the composition of the substances.

The reaction is advantageously monitored by IR spectroscopy, since isocyanate and the cyclization products produce very characteristic absorption bands.

In the novel process, the tetracarboxylic dianhydride can advantageously be used in excess in the reaction with the diamino compound, ie. in the preparation of the polyadducts (PA), in which case the resulting reaction product, a polyamidocarboxylic acid, is reacted with hydroxyethyl acrylate and/or methacrylate before the reaction with the olefinically unsaturated isocyanate, or the unsaturated isocyanate is used in an equivalent excess. In this way, the terminal anhydride groups are trapped and compounds having a clearly defined structure are obtained. The solubility too can be influenced by the trapping reagent; in particular, however, increased sensitivity of the radiation-reactive intermediates can be achieved, owing to the unsaturated nature of this component.

In addition to their use as photoresists and for the production of protective and insulating layers, where structuring is effected, the novel intermediates can also be used generally, in the unstructured form, for the production of protective and insulating coatings. These intermediates can particularly advantageously be used for the production of plastic coatings for the optical fibers of optical waveguides.

The invention is intended to be further illustrated by embodiments.

In the Examples which follow, parts and percentages are by weight, unless stated otherwise. Preparation of a polyadduct (PA): 109 parts (0.5 mole) of pyromellitic anhydride are dissolved with stirring in 486 parts of N-methylpyrrolidone at 60° C. under very pure nitrogen in a reaction flask which has pressure equilibration via a U-tube filled with drying agent. A solution of 100 parts of diaminodiphenyl ether in 350 parts of N-methylpyrrolidone is added via a dropping funnel in the course of one hour, the temperature increasing to 66° C.; stirring is continued for one hour at 75° C. and the reaction mixture is then cooled. The resulting viscous resin is characterized as follows:

Acid number: 53.2.

Viscosity: 5,750 mpa.s at a shear rate D of 100 s$^{-1}$.

IR spectrum: typical amide band combination at 1,720, 1,663, 1,543, 1,500 and 1,240 cm$^{-1}$.

Preparation of an unsaturated isocyanate (Ia)

174 parts of 2,4-toluylene diisocyanate (1 mole/2 equivalents) are stirred in a reaction flask under very pure nitrogen, and a solution of 116 parts of hydroxyethyl acrylate (1 mole/1 equivalent), 0.2 part of triethylenediamine and 127 parts of n-butyl acetate is added dropwise in the course of 3 hours. The temperature increases from 22° C. to 38° C., and decreases to room temperature after a further 3 hours. A pate yellow, lowviscosity liquid results.

NCO content: 5.7%.

Preparation of an unsaturated isocyanate (Ib)

The procedure described under (Ia) is followed, but the feed used comprises 129 parts of cinnamyl alcohol instead of hydroxyethyl acrylate. NCO content:, 5.3%

EXAMPLE 1

Preparation of the radiation-reactive intermediate 29 g of isocyanatoethyl methacrylate and 0.1 g of hydroquinone monomethyl ether are added rapidly to 200 g of the solution of the polyadduct (PA) described above and 0.1 g of triethylenediamine white stirring at room temperature. The apparatus is closed and connected to a wash bottle containing 10% strength sodium hydroxide solution, and a gentle stream of very pure nitrogen is passed. The mixture is heated to 80OC, and vigorous gas evolution occurs, which ceases after 35 minutes. The mixture is cooled to room temperature. The wash bottle shows a weight increase of 7.9 g. The resulting brown, clear, viscous resin solution has no isocyanate band in the IR spectrum.

EXAMPLE 2

The procedure described in Example 1 is followed, except that 37 g of the compound

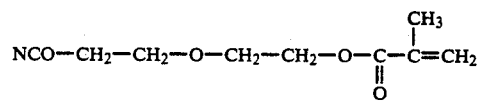

are used instead of isocyanatoethyl methacrylate.

A resin solution results, in which no isocyanate is detectable by IR spectroscopy.

EXAMPLE 3

The procedure described in Example 1 is followed, except that, instead of the unsaturated isocyanate used there, the isocyanate (Ia) is employed in an amount of 80 g.

EXAMPLE 4

The procedure described in Example 1 is followed, except that the isocyanate (Ib) is used in an amount of 83 g.

The radiation-reactive intermediates prepared according to the above Examples can, after the addition of photoinitiators (eg. mixtures of Michler's ketone and benzophenone), be applied to Si wafers by spin-coating, predried, exposed under a mask and then structured with solvents. After heating to temperatures >250° C., the resulting structures of the end product are well formed and have crisp edges.

I claim:

1. A process for the preparation of an oligomeric or polymeric radiation-reactive intermediate of a polyimide, polyisoindoloquinazolinedione, polyoxazinedione or polyquinazolinedione, wherein
   1) a carboxyl-containing polyadduct of an aromatic or heterocyclic tetracarboxylic dianhydride and a diamino compound, or
   2) a carboxyl-containing polyadduct of an aromatic or heterocyclic dihydroxydicarboxylic acid and a diisocyanate, or
   3) a carboxyl-containing polyadduct of an aromatic or heterocyclic diaminodicarboxylic acid and a diisocyanate is reacted with a reaction product which is prepared in situ without prior separation, which reaction product is an ethylenically unsaturated monoisocyanate which is the product of reaction of a diisocyanate and at least one ethylenically unsaturated compound which is reactive with isocyanate groups, which ethylenically unsaturated compound is selected from the group consisting of hydroxyalkyl (meth) acrylate, olefinically unsaturated monoalcohol, ethylenically unsaturated amine, ethylenically unsaturated amide, N-methylolamide, and N-methyloletheramide, wherein from 1.8 to 2.2 isocyanate groups of the diisocyanate are present in the reaction for each hydroxyl group of the alcohol, amino group of the amine, or nitrogen atom of the amide.

2. The process of claim 1, wherein the ethylenically unsaturated monoisocyanate is a mixture of compounds of the formula

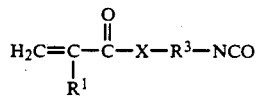

wherein $R^1$ is hydrogen or alkyl of 1 to 5 carbon atoms, and $R^3$ is a divalent alkylene radical of 1 to 12 carbon atoms, cycloalkylene, arylene or a radical $-R^4-Y-R^5-$, where Y is O, S, SO$_2$, CO or NR$^1$ and $R^4$ and $R^5$ are identical or different and are each alkylene or arylene, and the alkylene, cycloalkylene and arylene radicals may furthermore be halogen-substituted and X is NH.

3. A process as defined in claim 1, wherein the diisocyanate is toluylene diisocyanate, isophorone diisocyanate or a mixture of these diisocyanates.

4. A process as defined in claim 1, wherein the aromatic and/or heterocyclic tetracarboxylic dianhydride is pyromellitic anhydride or benzophenonetetracarboxylic anhydride.

5. A process as defined in claim 1, wherein the dihydroxydicarboxylic acid is 4,4'-dihydroxydiphenylmethane-3,3'-dicarboxylic acid.

6. A process as defined in claim 1, wherein the diaminodicarboxylic acid is 4,4'-diaminodiphenyl-3,3'-dicarboxylic acid.

7. A process as defined in claim 1, wherein 4,4'-diphenylmethane diisocyanate is used as the diisocyanate for the preparation of the carboxyl-containing polyadduct.

8. A process as defined in claim 1, wherein, for the preparation of the carboxyl-containing polyadduct, an aromatic and/or heterocyclic tetracarboxylic dianhydride is reacted with a diamino compound or with a diamino compound having one or more ortho amido groups, or an aromatic and/or heterocyclic dihydroxycarboxylic acid or a corresponding diaminodicarboxylic acid is reacted with a diisocyanate to give a carboxyl-containing reaction product, and the resulting reaction product is reacted with an olefinically unsaturated monoisocyanate at room temperature or at up to about 100° C. in an organic solvent in the presence or absence of a catalyst.

9. A process as defined in claim 8, wherein the tetracarboxylic anhydride is used in excess in the reaction with the diamino compound, and the resulting reaction product is reacted with a hydroxyalkyl acrylate or methyacrylate before the reaction with the ethylenically unsaturated isocyanate.

* * * * *

UNITED STATES PATENT AND TRADEMARK OFFICE
CERTIFICATE OF CORRECTION

PATENT NO. : 5,270,431
DATED : Dec. 14, 1993
INVENTOR(S) : BLUM

It is certified that error appears in the above-identified patent and that said Letters Patent is hereby corrected as shown below:

IN THE ABSTRACT

Line 2, "polyamides" should read --polyimides--.

Signed and Sealed this

Third Day of May, 1994

Attest:

BRUCE LEHMAN

Attesting Officer     Commissioner of Patents and Trademarks